United States Patent [19]

Amendola, deceased et al.

[11] Patent Number: 4,704,304

[45] Date of Patent: Nov. 3, 1987

[54] METHOD FOR REPAIR OF OPENS IN THIN FILM LINES ON A SUBSTRATE

[75] Inventors: Albert Amendola, deceased, late of Hopewell Junction, N.Y., by Nina Amendola, executrix; Ananda H. Kumar, Wappingers Falls; Thomas R. Vance, Salt Point, both of N.Y.

[73] Assignee: International Business Machines Corporation, Armonk, N.Y.

[21] Appl. No.: 923,242

[22] Filed: Oct. 27, 1986

[51] Int. Cl.⁴ ............................................. B05D 3/12
[52] U.S. Cl. ..................................... 427/57; 427/140; 427/142; 427/148; 427/264
[58] Field of Search ................. 427/57, 142, 140, 148, 427/147, 264, 286, 271

[56] References Cited

U.S. PATENT DOCUMENTS

| | | | |
|---|---|---|---|
| 3,614,832 | 10/1971 | Chance et al. | 29/846 |
| 4,442,137 | 4/1984 | Kumar | 427/57 |
| 4,493,856 | 1/1985 | Kumar et al. | 427/57 |
| 4,501,768 | 2/1985 | Kumar | 427/57 |
| 4,504,322 | 3/1985 | Adwalpalker et al. | 29/840 |

Primary Examiner—John H. Newsome
Assistant Examiner—Marianne L. Padgett
Attorney, Agent, or Firm—Steven J. Meyers

[57] ABSTRACT

Disclosed is a method for repairing opens in thin film conductor lines on a substrate, preferably a multi-layered ceramic substrate. An unpatterned repair metal film is placed over a general area of open defects in conductive lines on a substrate. Preferably, this metal is placed over the conductive lines and opens therein by decal transfer. The assembly is then heated to cause diffusion bonding between the repair metal and conductive lines, but not between the repair metal and substrate. After diffusion bonding, the structure has metal bridges formed across any open defects covered by the repair film and also between adjacent conductive lines. The area of repair is then subjected to ultrasonic energy in a liquid ambient for a time at least long enough to remove metal bridges between adjacent conductive lines, but less than that required to remove repair metal bridges over the opens in the conductive lines. The resultant structure has metal bridges spanning opens in the conductive lines, and no metal bridges between adjacent conductive lines.

8 Claims, 6 Drawing Figures

METHOD FOR REPAIR OF OPENS IN THIN FILM LINES ON A SUBSTRATE

FIELD OF INVENTION

This invention is directed to a method for producing substrates used for packaging semiconductor devices, more particularly to repairing discontinuities, hereinafter also referred to as opens in thin film conductor lines thereon by forming a thin, self-supporting, metal bridge across the opens with a metal repair film transferred from a decal and patterning the film using an ultrasonic horn.

BACKGROUND

Increase in the densities of devices on semiconductor chips has necessitated corresponding increases in circuit densities on ceramic packaging substrates used to mechanically support and electrically interconnect the semiconductor devices to input/output devices and to each other. This has led to the development and use of multilayer substrates with several layers of interconnected conductors to supply appropriate voltages to the device terminals, to communicate with other devices connected to the same substrate, and to fan out the very closely spaced terminal pads of the devices so as to make it possible to attach external connectors to them. The conductor patterns in the internal and surface planes of such multilayer substrates are commonly formed by screen printing with a paste or ink containing a substantial percentage of a refractory metal powder such as tugsten or molybdenum, the said pattern consolidating into solid metal lines upon a high temperature sintering step.

The circuit density, i.e. the number of circuit lines that could be formed in a unit area of the surface, in "thick film" circuits formed as above is severely limited by the screening techniques used to form them. Significantly higher circuit densities are realized if the circuit lines are fabricated by lithographic techniques in conjunction with vacuum deposited metal films - the so-called "thin film" techniques widely used in the fabrication of semiconductor devices. Such thin film circuit techniques are applied to the fabrication of circuit lines on ceramic and glass-ceramic substrates to decrease the interconnection lengths and to decrease the number of buried layers needed in multichip, multilayer substrates.

Thin film technology has made great strides in the fabrication of semiconductor devices to the point that patterns consisting of micron wide lines spaced a micron apart are routinely mass produced today. While in the case of semiconductor device fabrication, defects in isolated portions of the silicon wafer can be simply dealt with by discarding one or more chips located in the defective area, defects on any part of a large, multichip substrate surface could lead to the rejection of the entire substrate because of the extensive interconnection between all areas of the substrate. Thus, a major challenge facing the use of thin film technology on large, multichip ceramic substrates is the ability to fabricate defect-free thin film conductor patterns over a large area or, the ability to easily repair defects such as shorts and opens. Based on extensive experience from semiconductor fabrication technology, it is estimated that the ability to repair just a few such defects can make the difference between zero yields and yields in the 90% range.

Methods for repairing shorts, i.e. unwanted metal between conductor lines, are straightforward. These methods include laser ablation, abrasive jet trimming, selective etching and use of a mechanical cutting means to cut away the bridging metal. When the bridging metal is non-adhering to the surface underneath, an ultrasonic horn can be used to effectively remove the bridging metal as described in U.S. Pat. No. 4,504,322. In this method the region of the bridging or shorting metal is subjected to the action of intense ultrasonic vibrations produced in a coupling liquid medium such as water until the non-adhering metal spalls off. The opens that form in thin film metallization line patterns are most frequently caused by fine dust particles or fibers that adhere to the substrate surface. While the larger dust particles are normally removed by conventional cleaning methods used in thin film processing, the fine particles cause opens typically of a micrometer in length or less. It is impractical to fabricate large, multichip substrates with thin film conductor patterns in the absence of simple and effective repair techniques for open defects.

There are, however, a paucity of methods for localized repair of open defects. One method for repair of substrates having such open defects is to completely remove the defective pattern by etching or grinding and to repeat the lithographic and metallization steps. This strategy is expensive and, moreover, does not guarantee freedom from similar defects in the reworked pattern. In addition, there are many technical barriers to overcome to accurately overlay a repair pattern over the original pattern.

Since the open defects occur randomly across the thin film pattern and many different circuit patterns are utilized in substrates, and it is desirable to avoid accurate alignment requirements between the repair metal and substrate pattern, it is desired that the repair method should be non-specific to the pattern of the thin film lines at the location of the defect, but rather that it be universal. The use of a pre-patterned repair film should be precluded since it would require a new decal design each time a different circuit pattern was used or an open occurred in a different location, which would be very often. This would be extremely impractical and time consuming to attempt to implement. If the repair process requires accurate alignment of the repair metal with the open defects, the process would once again become impractical and uneconomical. Also, in the interest of not creating new defects in the originally defect-free areas of the thin film pattern during the repair process, it is desirable to limit the deposition of the repair metal substantially to the local area of the open defect, and not over a majority of the substrate. Hence, the repair method should be universal in nature and localized in size.

U.S. Pat. No. 4,259,367 discloses a method of repairing opens and shorts in semiconductor packages. The '367 patent demonstrates the complex steps required to repair thin film lines in the existing art. Utilizing the method of the '367 patent one must first use a laser beam or electron-beam to cut conductors on either side of shorts to convert them into opens, then depositing an insulating layer, and etching vias in the insulating layer to by-pass shorts and bridge opens in the underlying metallurgy. Then, strips of metallization are deposited to connect the respective vias in the insulation layer. This method is very complex and requires precise alignment and processing for many steps.

It is also undesirable to have to implement masks or the like to define where repairs should be made. Since the opens occur randomly, a unique mask, each covering a different area of the substrate, would be required for almost every repair situation. This would be very costly and extremely impractical to implement. Moreover, overlaying a mask on the delicate thin film metallization patterns is likely to cause further damage to the pattern. A universal, maskless repair means that can be implemented at any time in the substrate manufacturing process is desired.

U.S. Pat. No. 4,442,137 discloses a maskless method for overlaying protective metal coatings on a prior metal pattern on ceramic substrates. In this method, the metal chosen for overcoating is blanket deposited by vacuum evaporation or sputtering over the total substrate surface, covering both the metal pattern on it as well as the bare ceramic areas in between. The blanket deposited metal exhibits little discrimination in its physical adhesion to either the ceramic surface or the surface of the underlying pattern. Thus, the metal is bonded to both the pre-existing pattern and ceramic substrate. This is mostly due to the fact that atomic contact is made between the blanket deposited metal and the ceramic substrate because the inherent roughness of the ceramic substrate causes the substrate surface to trap sputtered or evaporated metallization which is deposited. The substrate is then heat treated in a suitable ambient to a temperature at which sufficient diffusion bonding occurs between the deposited metal and the metal pattern underneath while, simultaneously, promoting debonding and delamination of the deposited metal on the bare ceramic areas. A higher temperature than required to merely diffusion bond is required to debond the deposited metal from the ceramic. The debonding forces are created by the thermal expansion mismatch between the deposited metal and the ceramic substrate. Once the relative bonding and debonding is achieved, the substrate surface is then subjected to the action of an ultrasonic horn in water to cause the selective removal of the debonded metal from the bare ceramic areas leaving only the prior circuit pattern coated with the deposited protective metal.

The method of U.S. Pat. No. 4,442,137, however, is not well suited for repairing open defects by forming a metal bridge across the defects. In the '137 method, the metal film is directly deposited on to the substrate surface by vacuum deposition techniques. In the direct metal deposition, the metal is deposited everywhere on the substrate surface because deposition only onto repair areas through a mask is impractical as the occurrence of open defects is random and differs from substrate to substrate and may damage other metallization on the substrate. The direct deposition of metal onto the circuit pattern will result not only in the build up of metal thickness of the circuit lines but also in the increase in the width of the circuit lines and, hence, in the decrease in the spacing between the lines. This also increases the likelihood of causing shorts between the lines. In addition, since the heat treatment must delaminate the metal film from the ceramic surface in addition to promoting the diffusion bonding of the overlay metal to the circuit lines, the temperatures required to accomplish the process are relatively high in comparison to the temperatures required for diffusion bonding. Higher temperatures may cause excess deformation of the metal patterns and also tend to degrade the adhesion of the patterned thin film metal lines to the ceramic surfaces.

Moreover, when using gold as the repair metal, (which is a preferred repair metal because), direct deposition entails additional expense for the gold deposited on areas not required to have the reapair.

Thus, the 4,442,137 method is not suited for or intended for repairing thin film lines in the first place, and if it were applied to a repair operation, there would be numerous technical difficulties that would make such an application undesirable, and practically unfeasible.

In view of the above there is a need in the art for an improved method of repairing randomly occurring opens in conductive thin film circuit line patterns. There is also a need in the art for the repair technique to require no precise alignment of the repair metal over the defect area, no masks, and to require no photolighographic processes. It is also desired not to have costly sputtering or evaporation steps. There is also a need to have the repair film selectively bond to the patterned metallization, but not bond to the ceramic substrate so that high temperatures for debonding the excess metal would not be required, and there would be little chance of having residual metal cause shorts or increased line widths.

There is also a need for the repair means to be universal so that any random opens can be repaired, regardless of the exact shape of the open, or where it occurs on the pattern. The deposition of the repair metal should also be limited to the local area of the open.

SUMMARY

It is thereofre a primary object of this invention to provide a method for repairing randomly occurring open defects in thin film conductor line patterns by forming a bridging metal film across an open defect.

It is another object to be able to perform such repair with only a rough alignment between the repair metal and open.

It is another object for the repair method to be maskless and to require no photolithographic sputtering or evaporation processes.

Yet another object is to have the repair film bond to the original patterned metallization, but not to the underlying ceramic substrate.

Another object is for the repair means to be universal, so that any number random opens can be repaired in a localized area.

These and other objects of the invention are accomplished by the method of the present invention which overcomes most of the disadvantages associated with prior repair methods.

Briefly, the preferred method of carrying out this invention comprises placing a thin film of a suitable repair metal such as gold supported by a carrier foil such as polyimide onto the general area of the thin film pattern containing the open defect, placing a weight on the foil to promote intimate contact of the repair film surface with the circuit pattern to be repaired, heat treating the assembly in a furnace containing an inert or reducing atmosphere at a temperature sufficient to promote diffusion bonding of the repair film to the surfaces of the thin film lines that the film is held in contact with, and after cooling from the heat treating temperature, peeling off the polyimide support foil from the gold repair film.

After this portion of the method, metal bridges are formed both across the opens and also across adjacent lines. The bridge across adjacent lines would cause shorts if not removed and are thus undesired. A fundamental feature of the present invention is the discovery that when using an ultrasonic horn, (i.e. an arrangement including an ultrasonic transducer coupled to a means for focusing the ultrasonic energy, typically the focusing means being a wedge shaped metal structure) it is possible to selectively remove the unwanted bridges, while keeping the desired repair bridges. The use of an ultrasonic horn which has its tip immersed in water is preferred over other sources of ultrasonic energy because it enables a more controlled irradiation of the object to be treated. Thus, the next step is subjecting the general area of repair to the action of an ultrasonic horn held at close proximity (typically less than approximately 2 cm., and preferably between 0.025 cm. and 0.125 cm., depending on the exact ultrasonic energy utilized and the time desired for the repair process to take) to the film surface for a length of time sufficient to selectively remove the non-adhering, bridging gold film between adjacent conductor lines of the pattern without removing the bridging repair film across the line discontinuity being repaired. This process step is primarily based on our discovery that an ultrasonic horn can be used to selectively remove metal bridges, (i.e. metal not atomically bonded to the underlying substrate or metal pattern), of a certain minimum size (i.e. the distance D between adjacent patterned lines) without causing the removal of certain bridges below this size (i.e. the length of an open d). Thus, it is required that the span of the open defect be less than the distance between adjacent lines on the surface to be repaired. In real time manufacturing situations where the defects are not all the same size, and it is required to ultrasonically treat each part for a specific period of time that will be adequate for all defects on the part, it has been found that the span of the open defects should be no more than about one third of the spacing between the adjacent conductor lines in the region of the repair. This requirement thus sets the practical limit for the operability of the repair technique but is not violated in practice because the span of most open defects is typically much less, i.e., submicron, than the distance between lines, i.e., greater than 5 micrometers, in semiconductor packaging structures. Thus, the usefulness of the method is not diminished.

The above discovery that makes this selective metal removal possible is quantified in an empirical relationship between; time ($t_D$) required to remove a longer metallization line (D), and time ($t_d$) to remove a shorter metallization repair line (d) when these lines d,D are bridged or removed by the method of the present invention. The relationship is:

$$T_D/t_d = d^2/D^2$$

In pratice, d is equal to the length of the repair metal for the desired metal bridge across the open, while D is equal to the length of the undesired metal bridge across two adjacent lines, (the reason, as alluded to above, being that in semiconductor packaging, the opens are usually much less than a micrometer, while the distance between adjacent thin film lines are not in the micrometer or submicrometer range for packaging applications). $t_D$ and $t_d$ respectively represent the times required to ultrasonically remove metallization formed by the process of the present invention. In practice, using ultrasonic horns having varying power densities, the above relationship and laboratory observations have demonstrated that if the distance between adjacent lines (D) is at least approximately three times the length of open (d), then the metal between adjacent lines will be removed long before the repair metal over the open would be removed, i.e. $t_D$ is much less than $t_d$. This makes the repair process practical in real time manufacturing wherein defects of varying sizes are present, and it is desired to repair many defects at a single time. Thus, by applying the ultrasonic horn in the above process, for at least $t_D$, but less than $t_d$, the portions of the repair metal between adjacent lines can be selectively removed while the repair metal over opens remains intact.

DETAILED DESCRIPTION OF THE PREFERRED EMBODIMENTS

The preferred embodiments of the present invention comprise a group of process steps that are most easily understood by referring to FIGS. 1-5.

Figure 1:
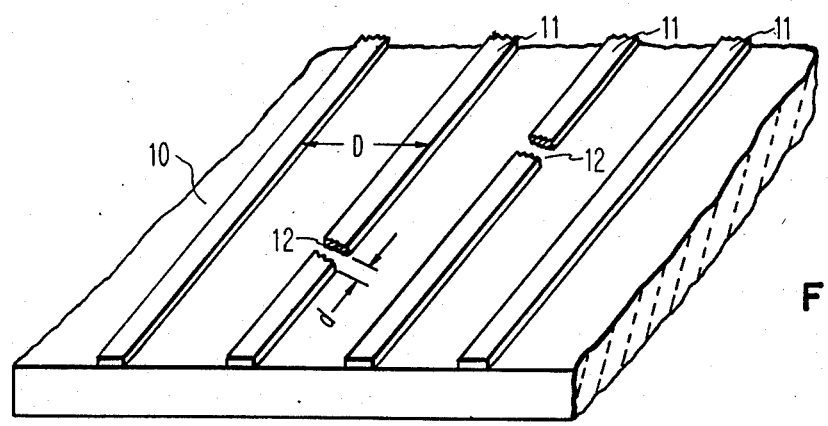
FIG. 1 shows a segment of a ceramic substrate having thin film conductors thereon, some of the conductors having open defects.

FIG. 1 shows a segment of a substrate 10 having a plurality of thin film conductor lines 11 thereon. At least one of the conductor lines has an open defect 12. It is the purpose of the method steps described herein to repair the open defects 12 with repair metallization. In the most preferred application of this method, the substrate 10 is made of a dielectric, preferably ceramic or glass ceramic, and the thin film conductors 11 are substantially parallel to each other. It is critical to this method that the distance D between adjacent conductor lines 11 should be longer than the length d of open defects 12. However, to accomplish the repair process in real time manufacturing situations where the defects are not all the same size, and it is required to ultrasonically treat each part for a specific period of time that will be adequate for all defects on the part, the span of the defect 12 should be no more than about one third of the spacing between adjacent thin film conductors 11. Preferably the distance D should be at least five times as long as the distance d. This contingency is commonly met in semiconductor packaging where the open defects caused by dust particles, etc. are often in the submicrometer range and spacing between adjacent lines 11 is greater than 5 micrometers, i.e. typically in the range of 20-200 micrometers.

Figure 2:
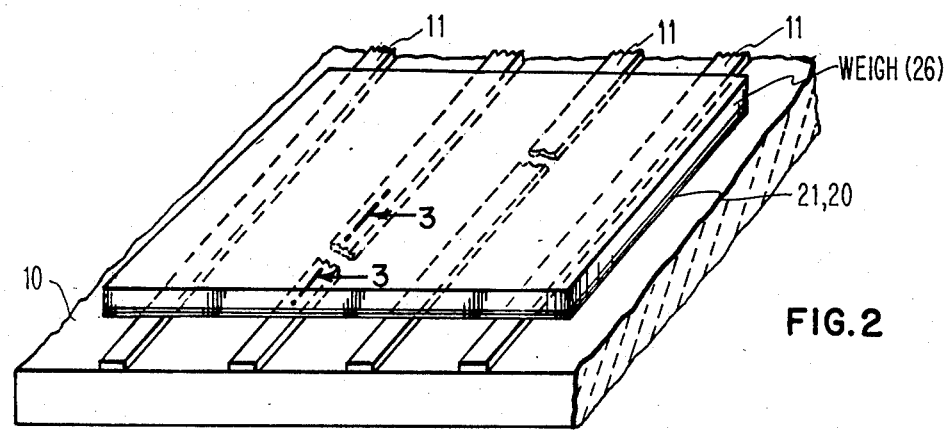
FIG. 2 shows the segment having a repair means placed thereon.

Referring to FIG. 2, upon the structure described above and shown in FIG. 1 is placed a substantially unpatterned metal repair film 20 wherein the metal repair film 20 covers at least one open 12 in circuit lines 11. Preferably, the film is grossly aligned in the general area of the opens 12, and covers more than one open. A single relatively large repair film, or a plurality of smaller films may be utilized; the theoretical smaller size limitation being that the film 20 should be at least the approximate cross-sectional area of said circuit lines 11, and be at least as long as opens 12. For partical purposes, the repair film is over 100 times the size of defects 12. In preferred form, repair film 20 is placed on the underlying circuit pattern by decal transfer techniques wherein a carrier foil 21 supports the thin film repair metal 20. By applying the repair metal by decal transfer and diffusion bonding (to be described later), there is no atomic bonding between the repair metal and substrate 10.

The forming of circuit interconnections and bonding pads on ceramic substrates by a decal transfer technique under heat and pressure has been described in U.S. Pat. No. 3,614,832. In the '832 patent and other methods used for decal transfer, a previously defined thin film pattern is aligned over bonding areas ona substrate, and is bonded to the substrate by the simultaneous application of heat and pressure or by ultrasonic or thermosonic energy using suitable transducers. The fixed disposition of bonding areas makes it convenient to use a patterned decal interconnection array which can be easily aligned thereto in an automated tool. However, in the case of the open defects in thin film patterns, the random occurrence of the defects precludes the use of a patterned decal because a new decal design would be required each time a different circuit pattern was used, or each time a defect occurred on another part of the substrate. Hence, the decal used in the present invention is a piece of unpatterned metal film, typically much larger in size than the open (i.e. approximately 100 to over 1,000 times larger), that is only grossly aligned over the general area of the substrate containing the open defect.

The preferred metal for the repair film is gold because of its ability to resist tarnishing, its high electrical conductivity, and the ease with which it diffuses into other common metals used for thin film circuits. Gold is also a common metal layer on many metallized surfaces wherein corrosion protection and solder wetability are important considerations.

Other metals including silver, copper, nickel platinum or palladium can also be used as repair metal. The key parameter in choosing a repair metal is the melting point. The melting point should be within the general range of the melting point of the original pattern to enhance eventual diffusion bonding between the repair metal 20 and underlying patterned lines 11.

The carrier foil 21 on which the repair metal 20 is preferably deposited, should (i) be capable of temporarily supporting the metal film without interacting with it, (ii) be able to withstand the diffusion heat treatment temperature without degradation, and (iii) allow easy parting from the metal film after the heat treatment step. Polyimide films are suitable for diffusion bonding heat treatments up to temperatures of about 400° C. For higher diffusion temperatures, a metal such as aluminum foil can successfully be used as the support film. An oxidized surfaces on such foils prevents any interaction with the repair metal during the heat treatment step. Alternatively, if the thickness of the repair metal film is about 5 micrometers or more, the film can be self-supporting.

After, or during placing the decal over the general area of the thin film pattern containing the open defect, a uniform force means 26 is applied to exert a downward force on the repair metal 20 and to promote intimate contact between the repair film surface and the circuit pattern to be repaired. Preferably, the force means 26 is a smooth weight.

Figure 3:
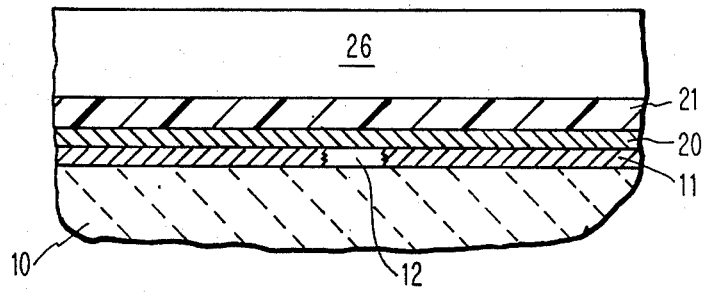
FIG. 3 shows the cross section of a ceramic substrate having thin film conductors and repair means thereon.

The cross section of Section 3—3 is shown in FIG. 3 wherein repair metal 20 is shown as covering metal line 11, bridging open defect 12. Decal backing 21 and weight 26 are also shown. Referring back to FIG. 2, note that the repair metal 20 also overlays areas of substrate 10. However, this metal does not atomically bond to substrate 10 as would metal deposited by conventional means such as evaporation or sputtering.

Figure 3A:
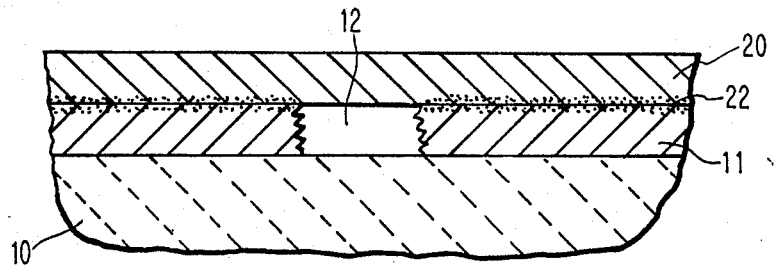
FIG. 3A shows the cross section of a ceramic substrate having thin film conductors thereon after the repair metal has been applied.
Figure 4:
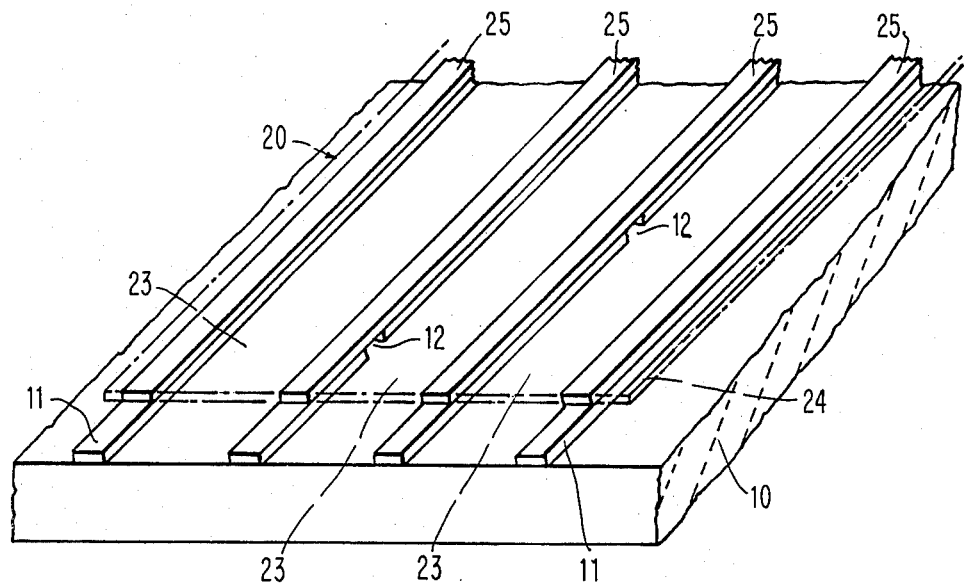
FIG. 4 shows a segment of a ceramic substrate having thin film conductors and repair metal thereon.
Figure 5:
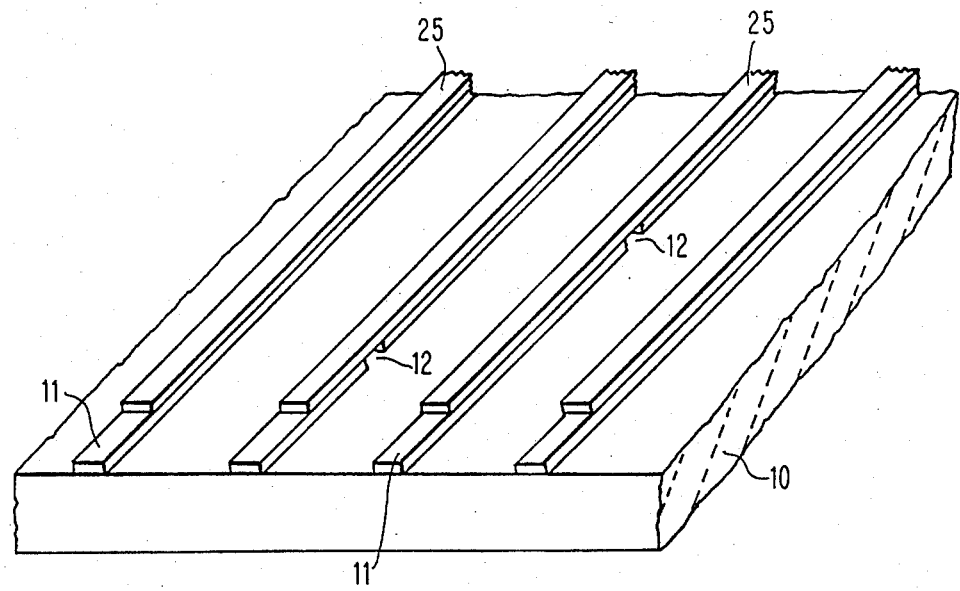
FIG. 5 shows a segment of a ceramic substrate having thin film conductors after the repair method of the present invention is completed.

Referring to FIGS. 3A and 4, the next process steps are described. The assembly of FIG. 2 is heat treated to cause diffusion bonding between the repair metal 20 and underlying metal lines 11. The diffusion bonding temperature is less than that of the repair metal melting point or circuit pattern metal point, but sufficient enough to those melting points to cause diffusion of atoms between the two metals. The exact diffusion bonding temperature required is a function of the time that is desired for the diffusion bonding to take place, the shorter the time required, the higher the diffusion bonding temperature that is required. The preferred diffusion bonding temperature is between about 30% and 85% of the melting point of the particular repair metal being used. In the preferred working example, for diffusion between two pieces of the same metal, e.g. gold, sufficient interdiffusion occurs at temperatures as low as 300°-500° C. The repair film must not be allowed to melt because this would cause the repair metal to draw away from the open gap due to surface tension. Also, the promotion of adhesion of the repair metal to the ceramic substrate surface must be avoided; otherwise the selective removal of unwanted metal described later herein would not be possible and costly cumbersome multi-step and multi-temperature metal removal and debonding steps would be required.

Although a furnace heat treatment is most suitable for the repair process where multiple repair sites are involved and where special heat treatment ambients may be needed, it is possible to heat the repair area locally through the use of electrically heated blocks placed on the repair film, or the use of lasers or infrared lamps. Since such local heating has to be for much briefer periods than is allowable in a furnace operation, the temperatures that need to be attained to obtain the same degree of diffusion bonding between the repair metal and the top surface of the circuit pattern will be higher.

In an application where the repair metal 20 is gold, and the underlying metal is also gold or a metal having a melting point in the general range of gold, the most efficient diffusion bonding occurs in the temperature range of 300°-500° C., preferably at approximately 400° C.

FIG. 3A shows a cross-section of the results after the heat treatment of the metallized substrate/repair metal assembly is heat treated, the hold down weight 26 removed, and the carrier foil 21 is stripped. Thin portions of the gold film 25 are shown adhering to the top surfaces of the conductor lines 11 by virtue of the diffusion bonded interface 22 formed between the two during the heat treatment.

Alternatively, the repair metal could be deposited on polished glass or ceramic blocks of suitable size, these blocks serving both to support their metal film and to act as the hold down weights during the heat treatment. Following the heat treatment the metal film will delaminate from the blocks due to the large thermal contraction mismatch between the two.

As shown in FIG. 4, the bulk of the gold film 23 forms connections between adjacent circuit lines 11, causing shorts. It is fundamental to the success of this process that the repair metal portions 25 remain intact while the metal 23 overlying the substrate be removed simultaneously, with no masking or varying of process steps. This is done in a single operation by using an ultrasonic vibrations, most preferably by using an ultrasonic horn which has its tip immersed in water.

This process step is primarily based on our discovery that an ultrasonic horn with its tip immersed in water can be used to selectively remove metal bridges, (i.e. metal not atomically bonded to the underlying substrate or metal pattern), of a certain minimum size (i.e. the distance D between adjacent patterned lines) without causing the removal of certain bridges below this size (i.e. the length of an open d). The smaller the span of the bridging metal film, the more difficult it is to remove it by ultrasonic horn action. Under given conditions, (i.e. varying horn amplitude, the proximity of the tip of the horn to the surface of the film, etc.), the time td of exposure to the ultrasonic horn action for the removal of the bridging film is found to be approximately inversely proportional to the square of the length of the metal bridge, i.e. $t_d/t_D = D^2/d^2$ Thus, if the metal repair film 20 has portions bridging across an open defect of 1 micrometer (distance d) and also across adjacent conductor lines spaced 5 micrometers apart, D; the time it takes for the removal of the two bridges under the action of the ultrasonic horn would be in the approximate ratio of 25 to 1. The bridging metal removal here can be considered as analogous to the etching of unwanted portions of a metal film in lithographic processes where an etch rate differential of 1:25 is more than adequate to create accurate lithographic patterns. The importance of the above to this invention resides in the fact that, except in the case of fine line circuitry encountered in VLSI devices, the width of an open defect tends to be significantly smaller than the spacing between adjacent circuit lines. These open defects, typically a micrometer in length or less, are the result of dust or fibers that tenaciously adhere to the substrate surface. Larger particles of dust get easily removed by the air cleaning methods normally installed in thin film facilities. This compares with typical line spacings of 5-10 micrometeres and more on the substrate surface of packaging structures.

The preferred and optimum distances for the ultrasonic horn tip to be from the repair film surface is approximately 0.025 to 0.125 cm. Ultrasonic energy levels, (which are measured in terms of amplitude of vibration of the horn), depend on the distance of the ultrasonic horn tip to the repair film surface. The typical range if the tip of the ultrasonic horn is 0.025 to 0.125 cm. from the repair surface (tip and repair surface being immersed in water), is between 0.00025 and 0.0125 cm. The preferred energy level is between approximately 0.00025 and 0.0075 cm. In the preferred energy level range, the bridges between adjacent lines of a 5 micrometer thick gold repair film are removed in approximately 5 to 20 seconds.

The following working example demonstrates the repair of open defects and removal of the unwanted bridging metal film 23 in a dense thin film package using the repair process of this invention. The substrate 10 is alumina-ceramic, and thin film lines 11 are nickel coated molybenum. A 5 micrometer thick self-supporting gold repair film 20 was transferred over 0.00125 cm. thin film lines 11 and open defects 12. The spacing between the lines 11 is 0.00125 cm., while the typical open defect distance was approximately 1-3 micrometers. The gold repair film was then diffusion bonded to the underlying lines 11 by heat treating in a nitrogen ambient at approximately 400° C. The substrate surfaces were then subjected to the action of an ultrasonic horn, vibrating with an amplitude of 0.075 cm., while the horn tip, which was 0.03 cm. from the repair surface, and substrate were immersed in water for a period of approximately 17 seconds. After this degree of exposure, the bridging gold film was completely cleared from between the thin film lines 11 and the gold repair film 25 remained intact, bridging open defect areas 12.

While the present invention has been disclosed in connection with the preferred embodiment thereof, it should be understood that there may be other embodiments which fall within the spirit and scope of the invention as defined by the following claims.

What is claimed is:

1. A method of repairing at least one open gap in conductive thin film circuit lines on a substrate comprising:

placing a metal repair film over the surface of said substrate with said metal repair film overlying at least one open gap in said circuit line;

said metal repair film being at least the length of said open gap and at least the approximate thickness of said circuit lines;

the length of any of said gaps being less than the distance between any adjacent circuit lines covered by said unpatterned metal repair film;

heating said metal repair film to a temperature high enough to cause diffusion bonding of said metal film to said circuit line but less than the melting point of either said repair metal or said circuit line, thereby bridging said open gap therein; and exposing the area of the repair to ultrasonic energy in a liquid ambient for a time equal to at least the time required for said metal repair film overlying said substrate between adjacent circuit lines to be removed, and less than the time required to remove said metal repair film from underlying circuit lines and open gaps in said circuit lines;

whereby only said repair film overlying circuit lines and open gaps in circuit lines remains.

2. The method of claim 1 wherein said metal repair film is affixed to a polymeric carrier, and then is placed over the area of the surface of said substrate overlying at least an open gap in said circuit line.

3. The method of claim 1 wherein said heating operation occurs at a temperature of between 30% and 85% of the melting point of the particular repair metal being used.

4. The method of claim 1 wherein the amplitude of vibration of said ultrasonic energy is in the range of approximately 0.00025 to 0.0125 cm.

5. The method of claim 1 wherein said heating operation occurs between approximately 300°-500° C.

6. The method of claim 1 wherein a downward force is placed on said metal repair film at least during heating.

7. The method of claim 4 wherein said ultrasonic energy is applied for at least approximately 5 seconds and less than approximately 30 seconds.

8. The method of claim 7 wherein said ultrasonic energy is applied by an ultrasonic horn having a tip immersed in a liquid, the distance between said tip and said repair film being greater than approximately 0.025 cm. and less than approximately 0.125 cm.

* * * * *